(12) United States Patent
Howland et al.

(10) Patent No.: US 6,972,582 B2
(45) Date of Patent: Dec. 6, 2005

(54) APPARATUS AND METHOD FOR MEASURING SEMICONDUCTOR WAFER ELECTRICAL PROPERTIES

(75) Inventors: William H. Howland, Wexford, PA (US); Robert G. Mazur, Sewickley, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 465 days.

(21) Appl. No.: 10/361,309

(22) Filed: Feb. 10, 2003

(65) Prior Publication Data

US 2004/0155240 A1  Aug. 12, 2004

(51) Int. Cl.⁷ ............................................. G01R 31/02
(52) U.S. Cl. ....................... 324/761; 324/750; 324/765
(58) Field of Search ............................... 324/761–765, 324/658, 719; 438/14–18; 257/78

(56) References Cited

U.S. PATENT DOCUMENTS

| | | |
|---|---|---|
| 3,803,489 A | 4/1974 | Miller |
| 4,633,285 A | 12/1986 | Hunsinger et al. |
| 4,812,756 A | 3/1989 | Curtis et al. |
| 4,949,144 A | 8/1990 | Kuroda et al. |
| 5,233,291 A | 8/1993 | Kouno et al. |
| 5,453,703 A * | 9/1995 | Goldfarb ..................... 324/765 |
| 5,523,241 A | 6/1996 | Wan et al. |
| 5,528,058 A | 6/1996 | Pike, Jr. et al. |
| 5,554,939 A | 9/1996 | Hirae et al. |
| 5,568,252 A | 10/1996 | Kusuda et al. |
| 5,936,413 A | 8/1999 | Booth et al. |
| 5,945,692 A | 8/1999 | Yano et al. |
| 6,037,781 A | 3/2000 | Kono et al. |
| 6,150,832 A | 11/2000 | Mazur et al. |
| 6,156,657 A | 12/2000 | Kuwabara et al. |
| 6,211,560 B1 | 4/2001 | Jimenez et al. |
| 6,232,143 B1 | 5/2001 | Maddix et al. |
| 6,255,128 B1 | 7/2001 | Chacon et al. |
| 6,492,827 B1 * | 12/2002 | Mazur et al. ............... 324/761 |
| 6,632,691 B1 * | 10/2003 | Howland ..................... 438/17 |
| 6,741,093 B2 * | 5/2004 | Howland et al. ........... 324/765 |
| 6,788,076 B2 * | 9/2004 | Howland ..................... 324/717 |

* cited by examiner

*Primary Examiner*—Vinh P. Nguyen
(74) *Attorney, Agent, or Firm*—The Webb Law Firm

(57) ABSTRACT

An apparatus for measuring at least one electrical property of a semiconductor wafer includes a probe including a shaft having at a distal end thereof a conductive tip for electrically communicating with an object area of the semiconductor wafer. The apparatus further includes a device for applying an electrical stimulus between the conductive tip and the object area, and a device for measuring a response of the semiconductor wafer to the electrical stimulus and for determining from the response the at least one electrical property of the object area of the semiconductor wafer. A probe guard is included that surrounds the shaft of the probe adjacent the distal end of the probe. The probe guard avoids electrical communication between the probe and areas outside of the object area of the semiconductor wafer.

16 Claims, 4 Drawing Sheets

APPARATUS AND METHOD FOR MEASURING SEMICONDUCTOR WAFER ELECTRICAL PROPERTIES

BACKGROUND OF THE INVENTION

1. Field of the Invention

This invention relates generally to an apparatus and method for measuring electrical properties of a semiconductor wafer.

2. Description of Related Art

The determination of electrical properties of a dielectric on a semiconductor wafer and/or a carrier density profile within the semiconductor wafer is a critical factor in the production of these wafers. In order to determine the electrical properties of the wafer, various techniques may be employed, including a capacitance-voltage (CV) measurement technique, a current-voltage (IV) measurement technique, a conductance-voltage (GV) technique and/or current-time (Ct) or lifetime measurement technique.

In some instances, the dopant concentration in the near surface region of a semiconductor surface must be profiled. Typically, in the absence of a metal oxide semiconductor (MOS) layer, this is accomplished using CV measurements, as applied to a Schottky barrier. A Schottky barrier is formed by applying a metal directly to the silicon or semiconductor material surface. However, the Schottky barrier formation process is tedious and time consuming. Further, CV measurements utilizing a Schottky barrier have five Debye length limitation (i.e., the dopant concentration can be profiled to within five Debye length from the surface). Alternatively, an oxide can be grown on the semiconductor material surface, and either a temporary or permanent metal contact can be made to the oxide surface to form a MOS junction. Utilizing a MOS junction yields superior performance, in that the doping concentration can be measured to within one Debye length from the oxide/material interface. However, in some cases, the user does not grow an oxide and, therefore, the Schottky method must be used.

Another problem with current measurement techniques stems from the electrical communication or interference between the object area or test site of the wafer and/or the probe with the surrounding region. The reduction of minority carrier generation from the surrounding region is required. Presently, this communication or interference is minimized by depositing a permanent guard ring 2 onto the oxide or dielectric surface surrounding a deposited test dot or object area 1. (See FIG. 1). However, the use of these deposited guard rings drastically increases processing times.

In order to map the semiconductor material surface, lateral movement between the probe and the wafer during CV and lifetime measurements is required. This lateral movement reduces mapping speeds. Still further, as discussed above, the measurements are subject to error due to interference from minority carriers.

It is, therefore, an object of the present invention to avoid or overcome the above problems and others by providing an apparatus for measuring the electrical properties of a semiconductor wafer having an improved probe configuration which minimizes interference or electrical communication from areas outside of the object area to the object area or the probe. It is another object of the present invention to provide a measurement apparatus that reduces mapping and measurement processing times and costs. Still further objects of the present invention will become apparent to those of ordinary skill in the art upon reading and understanding the following description.

SUMMARY OF THE INVENTION

Accordingly, we have invented an apparatus for measuring at least one electrical property of a semiconductor wafer. The apparatus comprises a probe including a shaft having at a distal end thereof a conductive tip. The conductive tip electrically communicates with an object area of the semiconductor wafer. The apparatus includes a means for applying an electrical stimulus between the conductive tip and the object area, as well as a means for measuring a response of the semiconductor wafer to the electrical stimulus and for determining from the response the at least one electrical property of the object area of the semiconductor wafer. The apparatus also includes a probe guard, which surrounds at least the shaft of the probe adjacent the distal end of the probe and which avoids electrical communication between the probe and areas outside of the object area of the semiconductor wafer or insulates the conductive tip from the semiconductor wafer.

In one embodiment, the probe guard completely surrounds the conductive tip of the probe and at least a portion of the shaft. Further, the probe guard is formed from an insulator material.

In another embodiment, the probe guard includes an insulator surrounding the shaft of the probe adjacent the distal end of the probe. In this embodiment, the probe guard also has a conductor surrounding the insulator. Also, it is envisioned that an alternating current bias, a direct current bias and an electrical ground or some combination thereof is applied to the conductor.

In a still further embodiment, the probe guard includes a second insulator surrounding the conductor. In this embodiment, the conductive probe tip can be formed from a conductive material, such as indium tin oxide, which is transparent to light, and the probe can include a light source, such as a light emitting diode (LED), which emits light through the transparent material portion of the probe tip toward the object area of the semiconductor wafer. The probe can also include an opaque portion surrounding the LED in order to prevent light emissions through portions of the probe other than the transparent material portion. In this embodiment, signals may be communicated to the object area via the LED and/or the transparent material conductive probe tip. However, regardless of the introduction technique, it is the response of the probe tip from which the measurements are derived.

The present invention, both as to its construction and its method of operation, together with the additional objects and advantages thereof, will best be understood from the following description of specific embodiments when read in connection with the accompanying drawings.

DETAILED DESCRIPTION OF THE PREFERRED EMBODIMENTS

Figure 2:
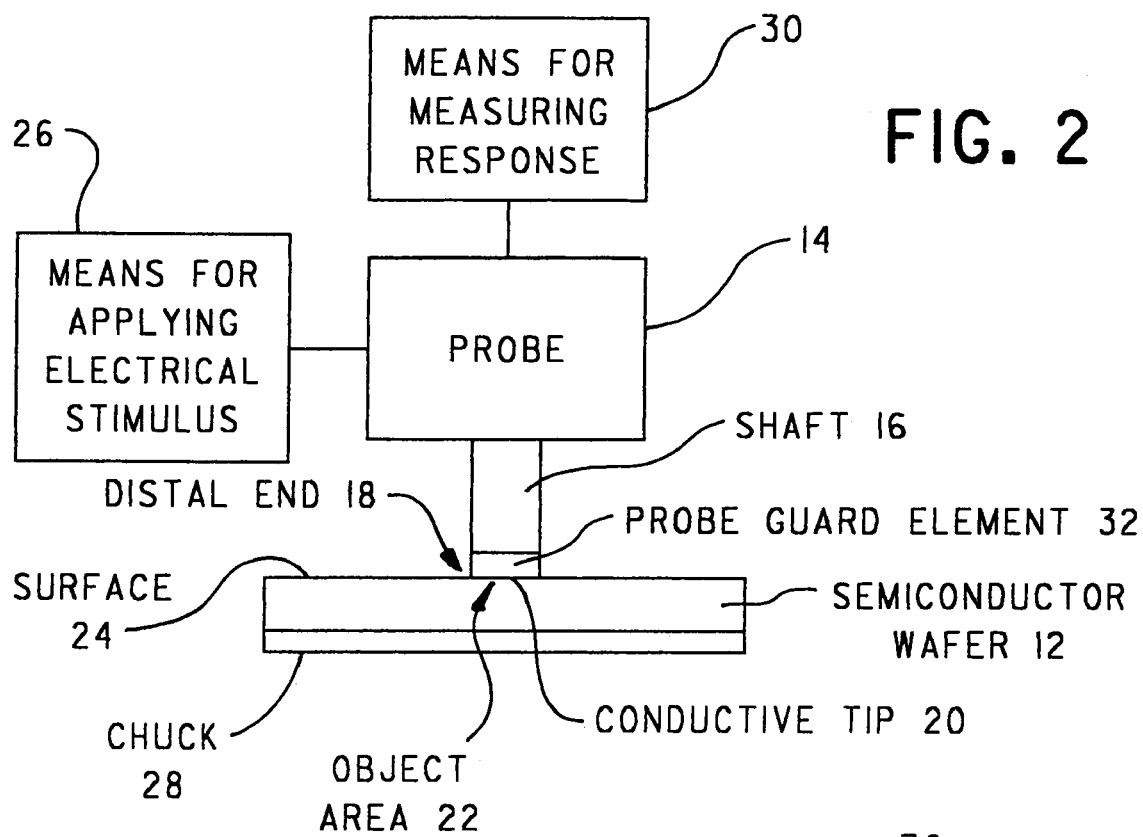
FIG. 2 is a block diagram view of an apparatus for measuring electrical properties of a semiconductor wafer according to the present invention.

Referring to FIG. 2, an apparatus for measuring electrical properties of a semiconductor wafer 12 includes a probe 14 having a shaft 16 with a distal end 18 defining a conductive tip 20 which enables electrical communication to be established between probe 14 and an object area 22 on and/or adjacent a front surface 24 of semiconductor wafer 12. Object area 22 is an area of the semiconductor wafer 12 that the user wishes to profile or measure the electrical properties of.

A means 26 for applying an electrical stimulus is connected between conductive tip 20 and object area 22 of semiconductor wafer 12. Applying means 26 includes devices that are well known in the art for applying, for example, a high frequency AC voltage, a high frequency AC voltage combined with a DC bias voltage, or a DC stress voltage or current between conductive tip 20 of probe 14 and a second electrical contact, typically a chuck 28 upon which semiconductor wafer 12 is mounted. A means 30 for measuring a response of semiconductor wafer 12, especially object area 22, to the electrical stimulus and for determining from that response at least one electrical property of object area 22 of semiconductor wafer 12 is connected between conductive tip 20 and object area 22 of semiconductor wafer 12. A probe guard 32 surrounds probe 14, at least adjacent distal end 18 thereof.

In operation, can apply means 26 applies to object area 22 via probe 14 a capacitance-voltage (CV) type electrical stimulus, a current-voltage (IV) type electrical stimulus, a conductance-voltage (GV) type stimulus and/or capacitance-time (Ct) or lifetime type electrical stimulus. At a suitable time after the stimulus has been applied to object area 22, measuring means 30 measures the respective one of the CV, IV, GV and Ct response of object area 22 to the corresponding electrical stimulus.

Figure 3:
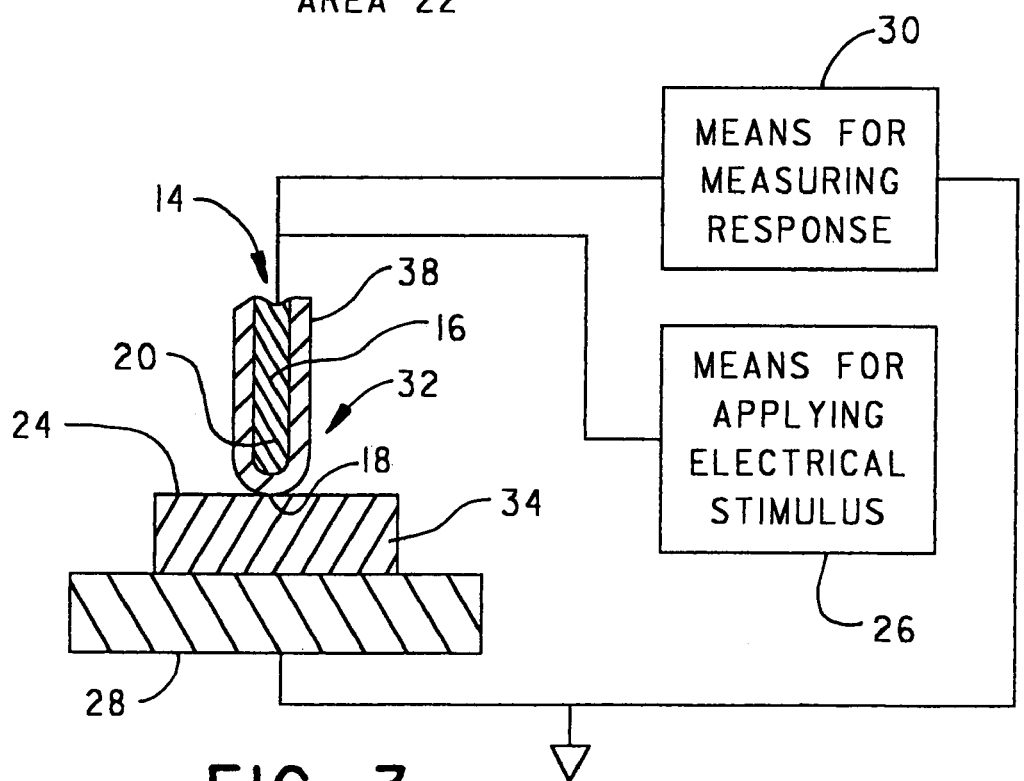
FIG. 3 is a side sectional and block diagram view of a first embodiment of the apparatus of FIG. 2 according to the present invention.

A first embodiment of probe 14 is illustrated in FIG. 3. In this embodiment, probe guard 32 includes an insulator 38 which surrounds conductive tip 20 and at least a part of shaft 16 adjacent conductive tip 20. In use, probe 14 is pressed against surface 24 of semiconductor wafer 12, by means known in the art, such as, without limitation, the Kinematic probe arm assembly disclosed in U.S. Pat. No. 5,023,561, which is incorporated herein by reference. More specifically, insulator 38 is pressed in direct contact with a semiconducting material 34 forming semiconductor wafer 12. Applying means 26 then applies a signal to object area 22 of semiconducting material 34 via conductive tip 20. Next, probe 14 receives and transmits the response of semiconducting material 34, especially object area 22, to measuring means 30. In FIG. 2, chuck 28 is used to complete the circuit for applying means 26 and measuring means 30. However, this is not to be construed as limiting the invention since other means known in the art for completing the circuits can also be utilized.

The use of probe guard 32 in this embodiment enables MOS measurement techniques to be performed without having to deposit or grow an oxide layer or dielectric layer directly on semiconducting material 34. Specifically, since insulator 38 is an insulator or dielectric which is received on distal end 18 of conductive tip 20, insulator 38 covering distal end 18 of probe 14 is able to contact the exposed semiconducting material 34 to form a MOS junction for measuring properties of semiconducting material 34 in object area 22. This MOS junction is comprised of conductive tip 20 (metal), insulator 38 in place of or in addition to a native oxide layer or thin dielectric layer (not shown) on surface 24 (oxide), and semiconductor material 34 (semiconductor). Preferably, conductive tip 20 is formed from elastically deformable material, such as an elastically deformable metal, a conductive elastomer, a conductive polymer, etc. However, this is not to be construed as limiting the invention.

In this first embodiment of probe 14, probe guard 32 eliminates the requirement to apply an insulting layer, e.g., an oxide layer, to semiconducting material 34 prior to profiling semiconductor wafer 12 utilizing one or more types of MOS measurement techniques. In addition, the use of the probe guard 32 extends the spatial resolution of this technique. To this end, prior art measurement techniques enabled measurements to within a five Debye length limitation. However, this first embodiment of probe 14 enables measurements to within a one Debye length limitation.

Figure 1:
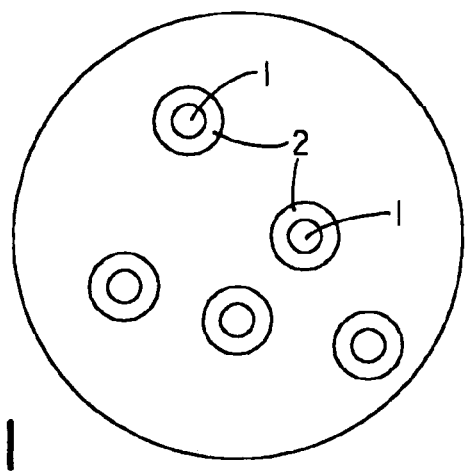
FIG. 1 is a top view of the prior art method of depositing a guard ring around a test site.
Figure 4:
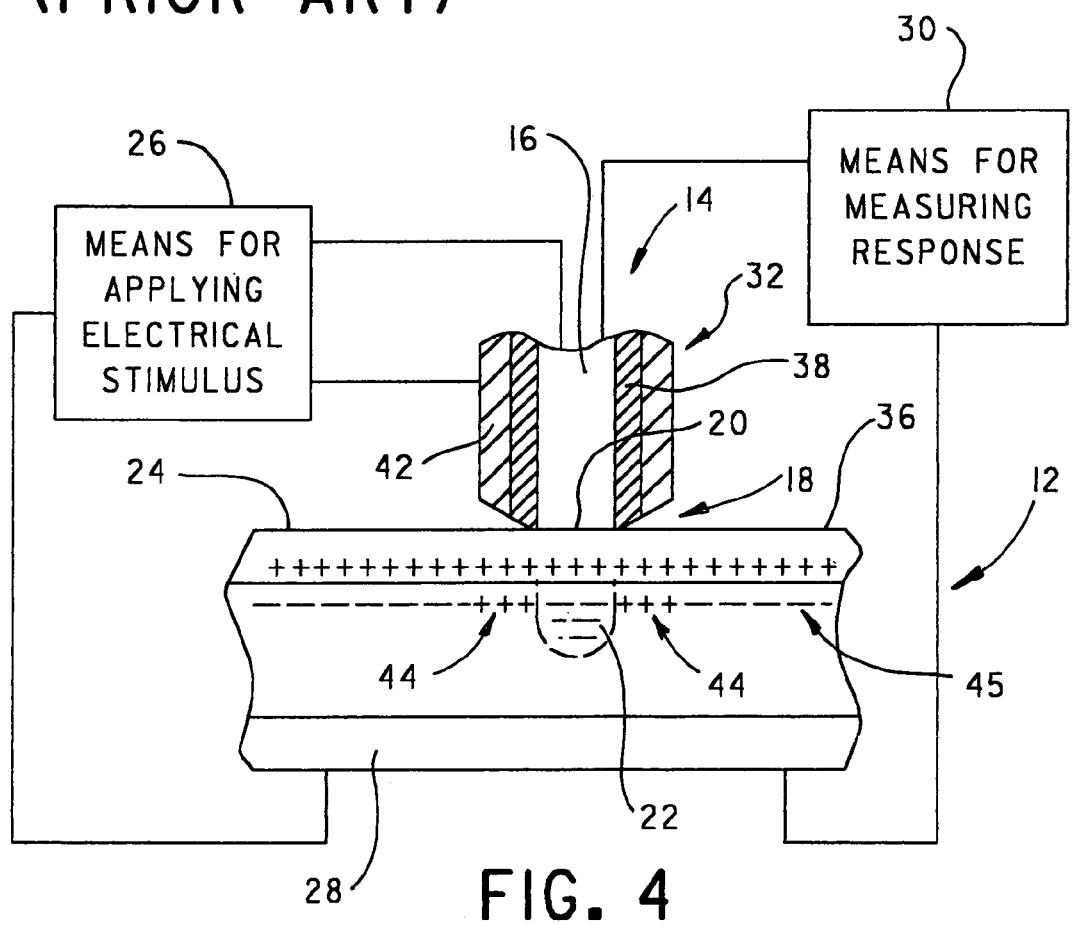
FIG. 4 is a side sectional and block diagram view of a second embodiment of the apparatus of FIG. 2 according to the present invention.

In many situations, front surface 24 of semiconductor wafer 12 includes a dielectric layer 36. A second embodiment of probe 14 for measuring electrical properties of semiconductor wafer 12 having dielectric layer 36 on front surface 24 thereof is shown in FIG. 4. In this embodiment, probe guard 32 includes insulator 38 surrounding shaft 16 adjacent distal end 18 of probe 14. Directly adjacent to and surrounding insulator 38 is a conductor 42. In this second embodiment, conductive tip 20 is exposed. Probe guard 32 including insulator 38 and conductor 42 reduces the effects of minority carriers in semiconducting material 34 during CV, GV and/or Ct measurements of object area 22.

In use of the second embodiment of probe 14, conductive tip 20 of probe 14 is pressed against or is moved into spaced relation to surface 24 of dielectric layer 36 by means known in the art. Next, when performing CV measurements, applying means 26 applies to conductive tip 20, conductor 42 and chuck 28 appropriate AC and/or DC bias voltages, including, as necessary, a reference ground, which, during application of the CV type electrical stimulus, causes majority and then minority carriers to accumulate in object area 22 while majority carriers are caused to accumulate in an accumulation region 44 surrounding object area 22. For p-type silicon, a negative DC bias voltage is applied to conductor 42, during the CV type electrical stimulus while for n-type silicon, a positive DC bias voltage is applied. The formation of accumulation region 44 around object area 22 avoids the inadvertent formation of an inversion layer 45, comprised of minority carriers, immediately around object area 22. In the absence of probe guard 32 in accordance with the second embodiment of probe 14, the surrounding inversion layer increases the measured capacitance by increasing the effective measurement area.

When performing Ct measurements with the second embodiment of probe 14, the goal is to measure the generation rate of minority carriers in object area 22. If accumulation region 44 contains an inversion layer, minority carriers in the inversion layer will drift into object area 22 and reduce the minority carrier generation rate occurring exclusively in object area 22. This effect gives rise to an apparently small generation lifetime, which is defined as the average time to generate a minority carrier. However, when using the second embodiment of probe 14 shown in FIG. 4, accumulation region 44 at least partially "blocks" minority carriers from entering object area 22 of semiconductor wafer 12.

When performing GV measurements with the second embodiment of probe 14, the goal is to determine from the GV measurements the interface state density of dielectric layer 36 on semiconducting material 34. Use of the third embodiment of probe 14 at least partially "blocks" minority carriers from entering object area 22 whereupon a GV measurement can be conducted without interference from these minority carriers.

Figure 5:
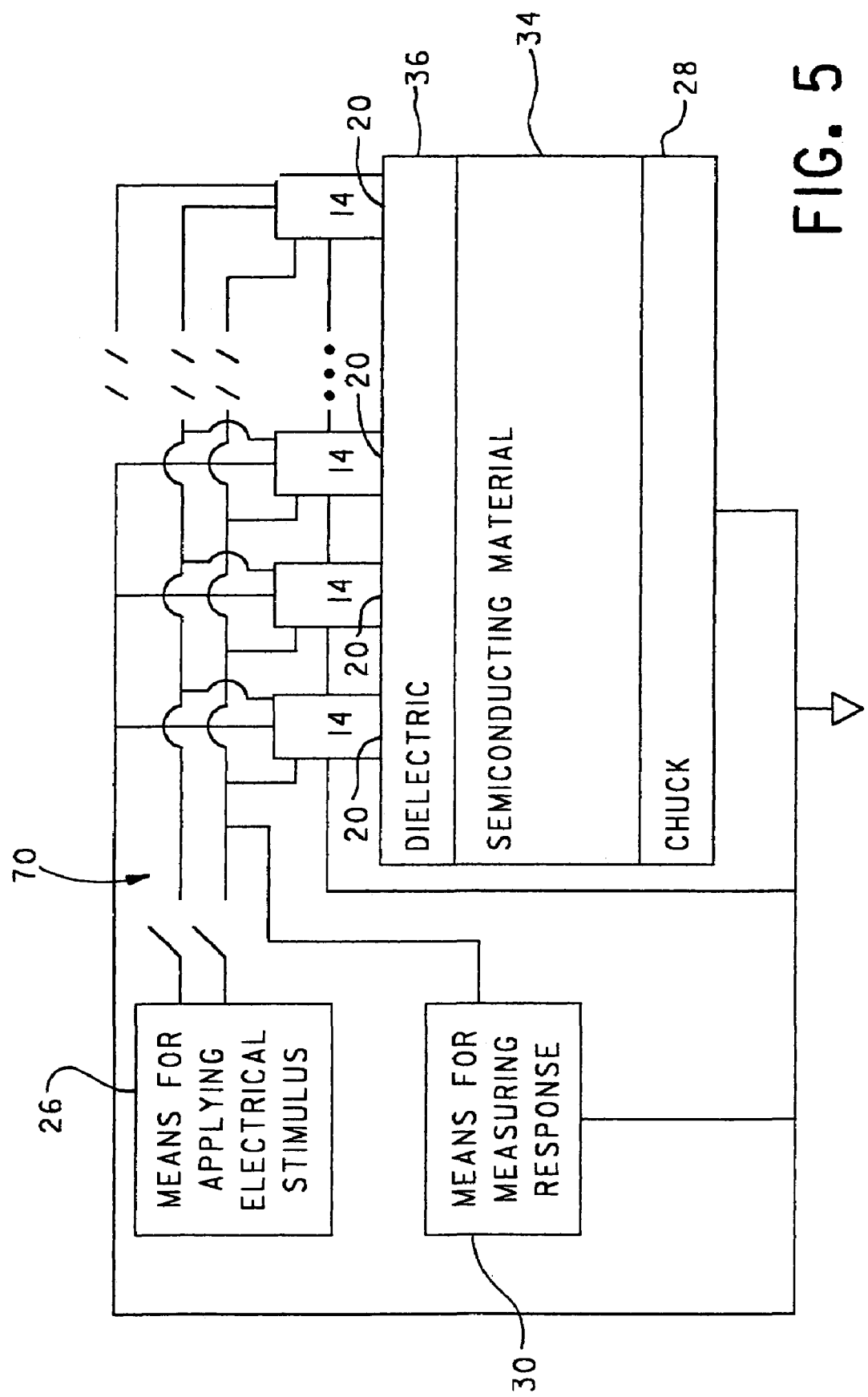
FIG. 5 is a block diagram view of a third embodiment of the apparatus of FIG. 2 according to the present invention.
Figure 6:
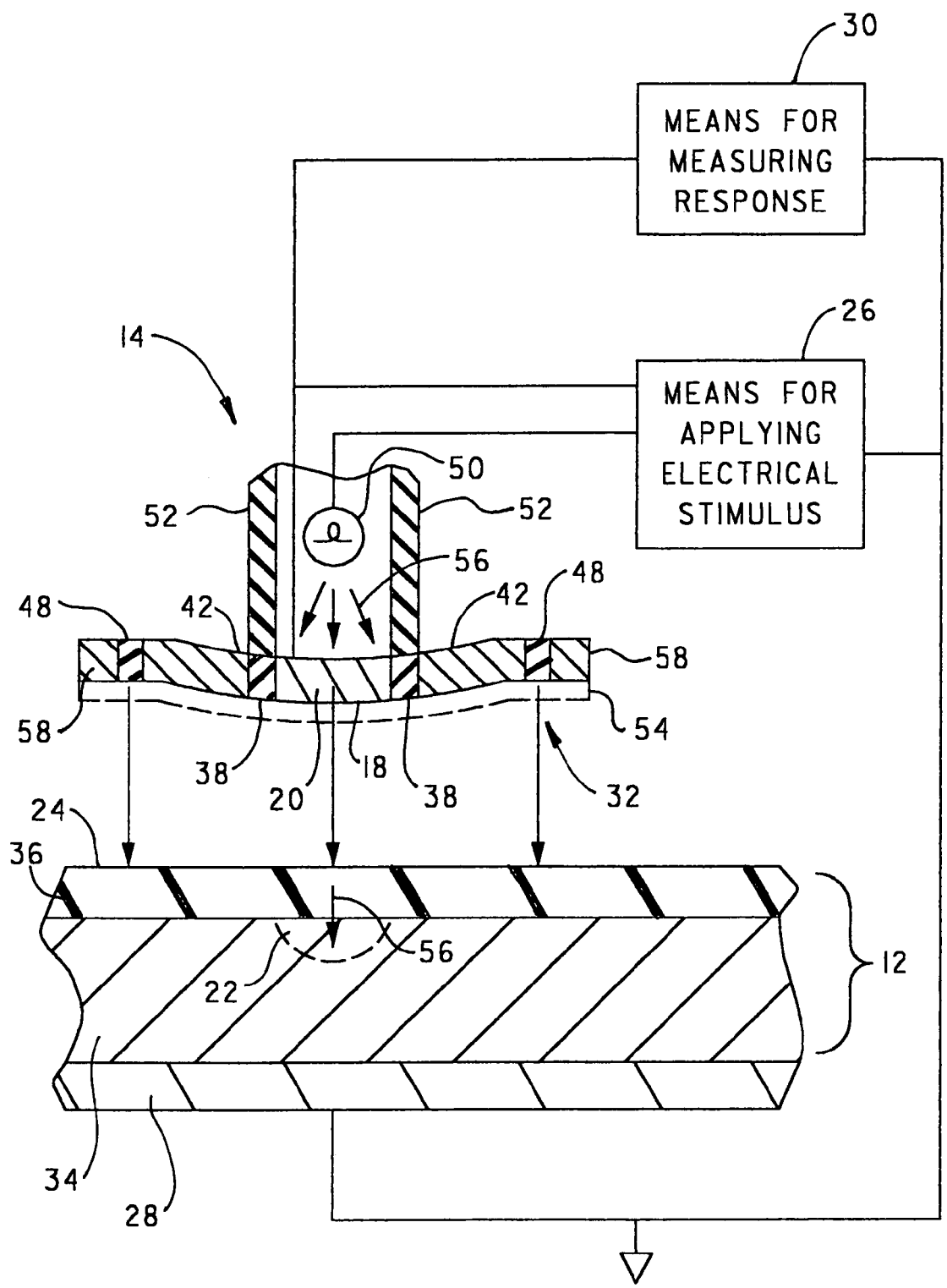
FIG. 6 is a side sectional view of a probe/wafer interface of the apparatus of FIG. 5 according to the present invention.

A third embodiment of probe 14 is shown in FIGS. 5 and 6. In this embodiment, distal end 18 of conductive tip 20 of probe 14 is exposed, and probe guard 32 includes insulator 38 immediately adjacent and surrounding conductive tip 20 and conductor 42 immediately adjacent and surrounding insulator 38. In addition, in this third embodiment of probe 14, probe guard 32 includes a second insulator 48 immediately adjacent and surrounding conductor 42. In this embodiment, applying means 26 can apply to conductive tip 20, conductor 42 and chuck 28 appropriate AC and/or DC bias voltages, including, as necessary, a reference ground bias.

In this third embodiment of probe 14, probe guard 32 can also include a second conductor 58 (shown in phantom) immediately adjacent and surrounding second insulator 48. In this embodiment, applying means 26 can apply an appropriate AC and/or DC bias voltage to second conductor 58 along with the appropriate AC and/or DC bias voltages applied to conductive tip 20, conductor 42 and chuck 28. As required by the application, the DC bias voltage applied to conductive tip 20, conductor 42, chuck 28 and/or second conductor 58, can be a reference ground bias.

The third embodiment of probe 14 can also include a light emitting diode (LED) 50 and conductive tip 20 can be formed from a material that is essentially transparent to light 56 emitted by LED 50. LED 50 can emit light 56 that passes through conductive tip 20 toward object area 22 of semiconductor wafer 12. Therefore, applying means 26 can also or alternatively apply an electrical signal to LED 50. In order to prevent light 56 emitted from LED 50 from impacting areas or zones outside of object area 22, probe 14 can also include an opaque portion 52 surrounding LED 50. Since conductive tip 20 is constructed from material that is essentially transparent to light 56 emitted by LED 50, when LED 50 emits light 56, while light 56 is prevented from penetrating opaque portion 52 of probe 14, light 56 passes through conductive tip 20 toward object area 22. It is also envisioned that applying means 26 can selectively apply an electrical signal to LED 50 and/or conductive tip 20.

In operation, conductive tip 20 of the third embodiment of probe 14 directly contacts dielectric layer 36. Alternatively, conductive tip 20 of the third embodiment of probe 14 is positioned in spaced relation to front surface 24 of dielectric layer 36, thereby forming a gap. In yet another alternative, an insulating layer 54 (shown in phantom) formed over distal end 18 of conductive tip 20 and, if necessary, over all or part of the surface of probe guard 32 facing semiconductor wafer 12 contacts dielectric layer 36. Insulating layer 54 may be silicon nitride ($Si_2N_4$), but this is not to be construed as limiting the invention. Insulating layer 54 or the gap between the third embodiment of probe 14 and dielectric layer 36 acts to reduce leakage on thin dielectric layer 36 during electrical measurement or profiling of semiconductor wafer 12. Regardless, when conductive tip 20 or insulating layer 54 of probe 14 either contacts outer layer 54 of dielectric layer 36 or when conductive tip 20 is positioned in spaced relation to front surface 24 of dielectric layer 36, applying means 26 applies one or more suitable electrical stimulus to probe guard 32, especially to conductor 42 and, if provided, second conductor 58, such that the object area 22 beneath probe 14 is in a state of accumulation.

As shown in FIG. 5, conductive tips 20 of multiple third embodiments of probe 14 can be applied simultaneously to dielectric layer 36 of semiconductor wafer 12. The use of multiple probes 14 allows for high speed mapping of lifetime and CV-based parameters without the need for lateral movement of a single probe 14 across front surface 24 of semiconductor wafer 12. The use of probe guard 32 on each third embodiment of probe 14 not only reduces electrical communication and interference from areas outside of each respective object area 22, but also each probe 14 in relation to one another. When multiple third embodiments of probe 14 are provided, it is envisioned that applying means 26 may use a switch matrix 70 for individually selecting each probe 14 for making measurements of the object areas 22 beneath each probe 14. More specifically, applying means 26 may use switch matrix 70 for individually selecting the conductive tip 20 of each probe 14 for making measurements of the object area beneath each probe 14. At the same time, applying means 26 may use switch matrix 70 to apply one or more suitable bias voltages to the probe guard 32 of each probe 14, either individually or simultaneously.

Each probe 14 can operate in one of two modes. In the first mode, suitable electrical stimuli may be applied to conductive tip 20 and one or both of conductor 42 and second conductor 58, if provided. At a suitable time after the stimuli are applied, the response of the corresponding object area 22 is measured and recorded by measuring means 30. For example, a first electrical stimulus is applied between semiconducting material 34 and conductive tip 20 and a second electrical stimulus is applied between semiconducting material 34 and conductor 42. A third electrical stimulus can also be applied between semiconductor material 34 and second conductor 58 if, provided. The first electrical stimulus is one of a capacitance-voltage (CV) type stimulus or a capacitance-time (Ct) type stimulus. The second electrical stimulus is a DC voltage or a ground reference. The third electrical stimulus can also be a DC voltage or a ground reference. The CV type and Ct type stimulus each includes superimposing an AC signal on a DC signal that is swept from a first, starting value to a second, ending value. The sweep of the DC signal for the Ct type stimulus is more rapid than the sweep of the DC signal for the CV type stimulus. For the Ct type stimulus, a first capacitance value of the semiconductor wafer is measured when the DC signal initially reaches the second value. The DC signal is maintained at the second value and a time for the capacitance of the semiconductor wafer to change from its first capacitance value to a second, steady state capacitance value is measured. From the time for the capacitance of semiconductor wafer to change from the first capacitance value to the second capacitance value, a generation lifetime of semiconducting material 34 can be determined.

In the second mode, suitable electrical stimuli may be applied to LED 50, conductive tip 20, conductor 42 and, if provided, second conductor 58. At a suitable time after the stimuli are applied, the response of the corresponding object area 22 is measured and recorded by measuring means 30. For example, applying means 26 can apply a first electrical stimulus between semiconducting material 34 and conductive tip 20, a second electrical stimulus between semiconducting material 34 and conductor 42 and a third electrical stimulus to LED 50. If probe 14 includes second conductor 58, a fourth electrical stimulus also can be applied thereto. The first electrical stimulus can be a Ct type stimulus. In this second mode, the Ct type stimulus includes superimposing an AC signal on a DC signal that has a value greater than a voltage threshold (Vt) value of semiconducting material 34 and, at the same time, selectively turning LED 50 on and off. A first capacitance value of semiconductor wafer 12 is measured when the LED 50 is turned on. After the LED 50 is turned off, a time for the capacitance of the semiconductor wafer to change to a second, steady state capacitance value is measured. The time for the capacitance of semiconductor wafer 12 to change from the first capacitance value to the second capacitance value is utilized to determine a recombination lifetime of semiconducting material 34. In both modes, measuring means 30 receives response signals from the corresponding object area 22 via conductive tip 20. These response signals are then measured and/or recorded by measuring means 30.

Overall, probes 14 in accordance with the present invention allow for the measurement of electrical properties of semiconductor wafer 12 with increased efficiency and accuracy. The use of probe guard 32 of the present invention provides effective blockage and minimal interference between each probe 14, object area 22 and areas outside of object area 22 or other probes 14. In essence, probes 14 in accordance with the present invention provide for isolated measurement of object area 22 in a timely and efficient manner, with reduced undesirable electrical communication. In addition, when using the multi-probe system shown in FIG. 5, high speed mapping of lifetime and CV-based parameters, without the need for lateral movement of a single probe 14, is achieved.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An apparatus for measuring an electrical property of a semiconductor wafer, the apparatus comprising:
   a probe having an electrically conductive tip;
   a probe guard disposed adjacent the electrically conductive tip;
   means for applying, when the electrically conductive tip contacts a surface of a semiconductor wafer, (i) a first electrical stimulus between the conductive tip and a semiconductor wafer that causes at least one of majority and minority carriers to accumulate in an object area of the semiconductor wafer and (ii) a second electrical stimulus between the probe guard and the semiconductor wafer that causes majority carriers to accumulate adjacent the object area; and
   means for measuring a response of the semiconductor wafer to the electrical stimuli and for determining from the response at least one electrical property of the semiconductor wafer.

2. The apparatus as set forth in claim 1, wherein the first electrical stimulus is one of a capacitance-voltage (CV) type stimulus, a conductance-voltage (GV) type stimulus and a capacitance-time (Ct) type stimulus.

3. The apparatus as set forth in claim 1, wherein the second electrical stimulus is a DC voltage.

4. The apparatus as set forth in claim 1, wherein:
   the probe includes a shaft having the electrically conductive tip at one end thereof; and
   the probe guard includes a electrical insulator surrounding the shaft of the probe at least adjacent the electrically conductive tip and an electrical conductor surrounding the electrical insulator at least adjacent the electrically conductive tip.

5. The apparatus as set forth in claim 4, wherein the second electrical stimulus is applied between the electrical conductor and the semiconductor wafer.

6. The apparatus as set forth in claim 1, wherein:
   the semiconductor wafer includes a dielectric layer overlaying a semiconductor material; and
   the surface of the semiconductor wafer is an exposed surface of the dielectric layer.

7. The apparatus as set forth in claim 6, wherein:
   the object area is an area of the semiconductor material adjacent the contact between the electrically conductive tip and the surface of the semiconductor wafer; and
   the second electrical stimulus causes majority carriers to accumulate in the semiconductor material surrounding the object area.

8. The apparatus as set forth in claim 1, wherein the conductive tip is formed from an elastically deformable material.

9. A method of measuring an electrical property of a semiconductor wafer comprising the steps of:
   (a) providing a probe having an electrically conductive tip and a probe guard disposed adjacent the electrically conductive tip;
   (b) forming a contact between the electrically conductive tip and a surface of a semiconductor wafer;
   (c) applying a first electrical stimulus between the conductive tip and the semiconductor wafer that causes at least one of majority carriers and minority carriers to accumulate in an object area of the semiconductor wafer;
   (d) applying a second electrical stimulus between the probe guard and the semiconductor wafer that causes majority carriers to accumulate adjacent the object area; and
   (e) measuring a response of the semiconductor wafer to the electrical stimuli and determining therefrom at least one electrical property of the semiconductor wafer.

10. The method as set forth in claim 9, wherein the first electrical stimulus is one of a capacitance-voltage (CV) type stimulus, a conductance-voltage (GV) type stimulus and a capacitance-time (Ct) type stimulus.

11. The method as set forth in claim 9, wherein the second electrical stimulus is a DC voltage.

12. The method as set forth in claim 9, wherein:
   the probe includes a shaft having the electrically conductive tip at one end thereof; and
   the probe guard includes a electrical insulator surrounding the shaft of the probe at least adjacent the electrically conductive tip and an electrical conductor surrounding the electrical insulator at least adjacent the electrically conductive tip.

13. The method as set forth in claim 11, wherein the second electrical stimulus is applied between the electrical conductor and the semiconductor wafer.

14. The method as set forth in claim 9, wherein:
   the semiconductor wafer includes a dielectric layer overlaying a semiconductor material; and
   the surface of the semiconductor wafer is an exposed surface of the dielectric layer.

15. The method as set forth in claim 14, wherein:
   the object area is an area of the semiconductor material adjacent the contact between the electrically conductive tip and the surface of the semiconductor wafer; and the second electrical stimulus causes majority carriers to accumulate in the semiconductor material surrounding the object area.

16. The method as set forth in claim 9, wherein the conductive tip is formed from an elastically deformable material.

* * * * *